United States Patent [19]

Ogawa et al.

[11] Patent Number: 6,127,857
[45] Date of Patent: Oct. 3, 2000

[54] OUTPUT BUFFER OR VOLTAGE HOLD FOR ANALOG OF MULTILEVEL PROCESSING

[75] Inventors: Katsuhisa Ogawa, Machida; Tadahiro Ohmi, Sendai; Tadashi Shibata, Tokyo, all of Japan

[73] Assignee: Canon Kabushiki Kaisha, Tokyo, Japan

[21] Appl. No.: 09/110,011

[22] Filed: Jul. 2, 1998

[30] Foreign Application Priority Data

Jul. 2, 1997 [JP] Japan .................................. 9-176868
Jul. 2, 1997 [JP] Japan .................................. 9-176869

[51] Int. Cl.[7] .................................................. H03K 19/00
[52] U.S. Cl. ............................ 327/94; 327/436; 327/437
[58] Field of Search .................................. 327/427, 430, 327/431, 434, 435, 436, 90, 94

[56] References Cited

U.S. PATENT DOCUMENTS

| | | | |
|---|---|---|---|
| 4,476,448 | 10/1984 | Saari | 333/173 |
| 4,656,611 | 4/1987 | Suyama | 365/203 |
| 4,712,023 | 12/1987 | Otsuki et al. | 326/83 |
| 4,760,284 | 7/1988 | Taylor | 327/566 |
| 4,939,390 | 7/1990 | Coe | 326/115 |
| 5,459,428 | 10/1995 | Kim et al. | 327/387 |
| 5,541,444 | 7/1996 | Ohmi et al. | 257/587 |
| 5,744,994 | 4/1998 | Williams | 327/374 |
| 5,834,962 | 11/1998 | Okamoto | 327/333 |
| 5,835,045 | 11/1998 | Ogawa et al. | 341/155 |

*Primary Examiner*—Terry D. Cunningham
*Attorney, Agent, or Firm*—Fitzpatrick, Cella, Harper & Scinto

[57] ABSTRACT

In order to prevent an output offset voltage from occurring because of a relative difference of threshold voltage Vth between NMOS and PMOS in transmission of dc voltage, a semiconductor integrated circuit is constructed in a circuit configuration comprising a first depletion-mode N-channel MOS transistor and a first depletion-mode P-channel MOS transistor, a gate of each transistor being connected to an input terminal and a source of each transistor being connected to an output terminal, a second depletion-mode N-channel MOS transistor having W/L equal to that of the first depletion-mode P-channel MOS transistor, a drain of the transistor being connected to the output terminal and a gate and a source of the transistor being connected both to a lower-voltage-side power supply, and a second depletion-mode P-channel MOS transistor having W/L equal to that of the first depletion-mode P-channel MOS transistor, a drain of the transistor being connected to the output terminal and a gate and a source of the transistor being connected both to a higher-voltage-side power supply.

7 Claims, 7 Drawing Sheets

Iss = Iss1 = Iss2

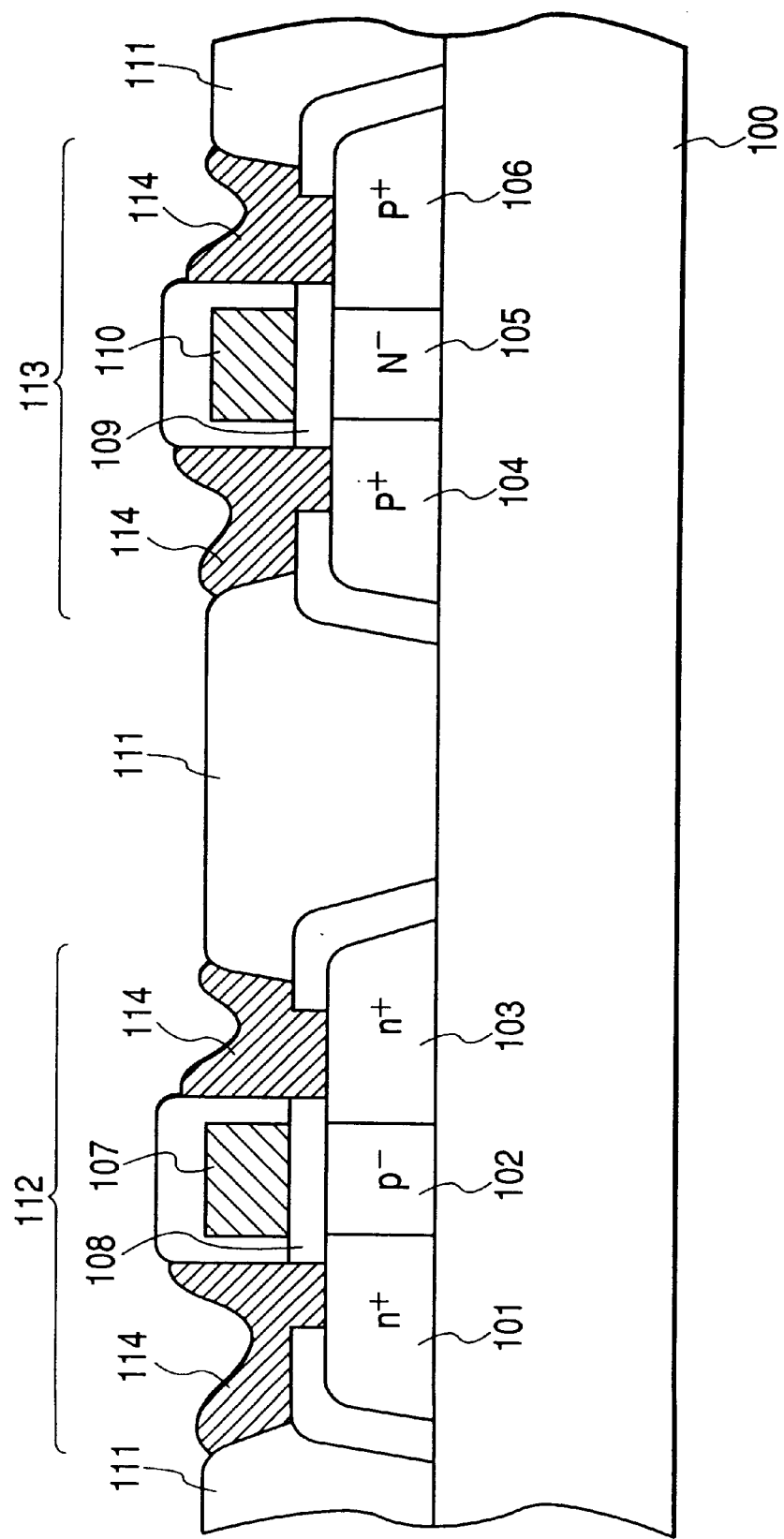

OUTPUT BUFFER OR VOLTAGE HOLD FOR ANALOG OF MULTILEVEL PROCESSING

BACKGROUND OF THE INVENTION

1. Field of the Invention

The present invention relates to a semiconductor integrated circuit and, more particularly, to a semiconductor integrated circuit capable of output buffer or voltage hold, which can be suitably used in analog signal processing or multilevel signal processing.

2. Related Background Art

Source followers using NMOS transistors and constant-current power supplys have widely been used as an output buffer for analog signal processing and multilevel signal processing, designed using the MOS processes (or the CMOS processes).

FIG. 1 illustrates an example of the NMOS source follower. In a configuration with an NMOS transistor 50 for output drive whose gate terminal is an input terminal 3, whose source terminal is an output terminal 4, and whose drain terminal is connected to a power-supply voltage 5, a drain terminal of an NMOS transistor 51 for constant-current power supply is connected to the output terminal 4, the source terminal of the NMOS transistor 51 is connected to ground potential 6, and the gate terminal thereof is connected to a gate-drain common connection point of an NMOS transistor 52 whose source terminal is connected to the ground potential 6. A constant-current power supply 53 is connected between the gate-drain common connection point of NMOS transistor 52 and the power-supply voltage 5, and a current mirror circuit is constructed of the NMOS transistor 51 for constant-current power supply, the NMOS transistor 52, and the constant-current power supply 53.

When the NMOS transistor 51 for constant-current power supply and the NMOS transistor 52 have an equal ratio of W/L (W: channel width, L: channel length), the drain current the transistor 51 for constant-current power supply becomes equal to the current of the constant-current power supply 53. The drain current of the transistor 51 for constant-current power supply becomes a dc operating point or idling current of the NMOS transistor 50 for output drive. During driving of a load, in the case of a sink current load, the drain terminal of the transistor 51 for constant-current power supply draws the load driving current; in the case of a source current load, the load driving current is delivered from the drain terminal of the NMOS transistor 50 for output through the source terminal. Since the input terminal 3 is the gate terminal in this configuration, a signal from a preceding stage is received at high impedance; and the output terminal 4 is the source terminal, so that a load circuit of a subsequent stage can be driven at low impedance. In order to eliminate the substrate bias effect of MOS transistor so as to achieve linear input/output characteristics, the substrate terminal and source terminal of the NMOS transistor 50 for output drive are electrically connected.

When accurate transmission of dc voltage was tried to be carried out in analog processing and multilevel processing in the NMOS source follower circuit, a dc level shift equivalent to the gate-source voltage Vgs of the MOS transistor occurred to hinder the dc transmission, however. This phenomenon will be described using FIG. 2. FIG. 2 illustrates Id-Vgs characteristics of the NMOS transistor 50. When a voltage not less than the threshold voltage Vth is applied as the gate-source voltage Vgs, the drain current Id flows. Namely, when the drain current Id is allowed to flow, the gate-source voltage Vgs, which is determined by Vth and Id, appears. The source potential of the transistor 50 for output biased by Id, always becomes Vgs=Vα smaller than the gate potential. This is the dc level shift between input and output. This shift is not constant and varies within a certain range. Namely, the shift has a variation distribution because of the principal factors including manufacturing variations of Vth of NMOS transistor 50 for output and setting variations of the drain current of the transistor 51 for constant-current power supply. As described, the dc level shift due to Vgs is not constant and in addition, Vgs also has a temperature drift. It is thus not easy to achieve accurate transmission of signals including dc values by the circuit shown in FIG. 1. Some Vgs-canceling circuits were also proposed, but they increased the number of circuit components and also increased electric power consumption, thus being a hindrance against increase in integration.

Considering applications to the analog processing, this problem of output dc level shift makes accurate dc-linked signal processing difficult. Considering applications to voltage mode multiple-valued logic circuits, the occurrence of dc level shift in the buffer will considerably degrade the noise margin of multilevel signal processing.

FIG. 3 is a circuit setup diagram to show an example of a complementary source follower. The gate terminals of respective NMOS transistor 340 and PMOS transistor 341 are connected to each other to compose an input terminal 305, the source terminals of the respective transistors are connected to each other to compose an output terminal 306, the drain terminal of the NMOS transistor 340 is connected to power-supply voltage 307, the drain terminal of the PMOS transistor 341 is connected to ground potential 308, and the load driving current is delivered from the drain terminal through the source terminal. Since the input terminal 305 is composed of the gate terminals of the both transistors in this configuration, the signal from the preceding stage is received at high impedance; since the output terminal 306 is composed of the source terminals of the both transistors, the load circuit of the subsequent stage can be driven at low impedance. In order to eliminate the substrate bias effect of the MOS transistors to achieve linear input/output characteristics, the substrate terminal and source terminal of each of the NMOS transistor 340 and PMOS transistor 341 are electrically connected.

FIG. 4 is a circuit setup diagram of another complementary source follower. The gate terminals of respective NMOS transistor 350 and PMOS transistor 351 are connected to each other, the drain terminal of the NMOS transistor 350 is connected to power-supply voltage 307, and the source terminal thereof is connected to constant-current power supply 354 and also to the gate terminal of PMOS transistor 353 for output drive. The drain terminal of the PMOS transistor 351 is connected to ground potential 308, and the source terminal thereof is connected to constant-current power supply 355 and also to the gate terminal of NMOS transistor 352 for output drive. The source terminals of the respective NMOS transistor 352 and PMOS transistor 353 are connected to each other to compose the output terminal 306 to drive a capacitive load at high speed. The drain terminal of the NMOS transistor 352 is connected to the power-supply voltage 307, the drain terminal of the PMOS transistor 353 is connected to the ground potential 308, and thus the load driving current is delivered from the drain terminal through the source terminal. Since the input terminal 305 is the connection point between the gate terminals of the two transistors in this configuration, the signal from the preceding stage is received at high impedance; since the output terminal 306 is composed of the source terminals of the two MOS transistors, the load circuit of the subsequent stage can be driven at low impedance. In the case where the ratios W/L (W: channel width, L: channel length) of the pair of PMOS transistors 351, 353 and the pair of NMOS transistors 350, 352 are equal to each other, where the currents of the constant-current power supplys 354 and 355 are Iss1 and Iss2, respectively, and where Iss=Iss1=Iss2, the idling current Ibias, which penetrates the NMOS transistor 352 and PMOS transistor 353 composing the output drive stage, is Iss, so that the gate-source voltages of the respective pairs of PMOS transistors 351, 353 and NMOS transistors 350, 352 are equal to each other. Therefore, no dc level shift occurs between the input terminal 305 and the output terminal 306. In order to eliminate the source bias effect of the MOS transistors to achieve the linear input/output characteristics, the substrate terminal and source terminal of each of the NMOS transistors 350, 352 and PMOS transistors 351, 353 are electrically connected.

Features of the complementary source follower are as follows. When the current flows from the output terminal to the load, the NMOS transistor 352 delivers the load driving source current; when the current flows from the load to the output terminal, the PMOS transistor 353 delivers the load driving sink current; whereby high-speed driving is allowed against a load of a large capacity.

When accurate transmission of dc voltage was tried to be carried out in analog processing and multilevel processing in the complementary source follower circuit, there arose, however, a problem of occurrence of output offset voltage due to a relative difference of threshold voltage Vth between the NMOS and PMOS transistors. This problem will be described using the complementary source follower circuit of FIG. 3. The dc operating point of this circuit is determined as an idling current in a state where the drain currents of the NMOS transistor 340 and PMOS transistor 341 are equal. When the threshold voltages Vth of the respective NMOS transistor 340 and PMOS transistor 341 are equal to each other, a very small drain current flows to bias the gate-source voltage Vgs of each MOS transistor to 0 V, thus generating no output offset voltage. When the relative difference of Vth occurs between NMOS and PMOS, the drain currents as idling currents of the NMOS transistor 340 and PMOS transistor 341 are equal to each other, and thus the voltages Vgs are different between the two transistors because of the difference of Vth. For example, when Vth of the NMOS transistor 340 is greater, Vgs of the NMOS transistor 340 during idling also becomes larger, so as to produce a negative offset in the output. When Vth of the PMOS transistor 341 is greater, Vgs of the PMOS transistor 341 during idling becomes larger, so as to produce a positive offset in the output. There is no relative matching element for the Vth characteristics between NMOS and PMOS in terms of fabrication in the CMOS processes, and thus the output offset varies depending upon manufacturing variation of Vth.

The complementary source follower circuit of FIG. 4 is a circuit for ideally canceling the relative difference of Vth between NMOS and PMOS and thus generating no output offset. When W/L between the NMOS transistors 350, 352 and W/L between the PMOS transistors 351, 353 are equal, the idling current Ibias flowing between the NMOS transistor 352 and the PMOS transistor 353 composing the output drive stage becomes equal to Iss (=Iss1=Iss2), so that Vgs between the NMOS transistors 350, 352 and Vgs between the PMOS transistors 351, 353 also become equal to each other. At this time the following equation holds.

$$Vgs350(Iss1) + Vgs353(Ibias) = Vgs351(Iss2) + Vgs352(Ibias)$$

As long as the above equation is satisfied, no offset voltage appears at the output terminal 306 even with a relative difference of Vth between NMOS and PMOS. There are, however, cases where the relation of Iss1=Iss2 is not achieved because of mismatch between the current mirrors of the constant-current power supply 354 for supplying Iss1 and the constant-current power supply 355 for supplying Iss2 whereby an offset voltage thus appears at the output. Further, the complementary source follower circuit of FIG. 4 needs to include the NMOS source follower composed of the NMOS transistor 350 and the constant-current power supply 354, the PMOS source follower composed of the PMOS transistor 351 and the constant-current power supply 355, and the bias circuits for setting of Iss1, Iss2, in addition to the output drive MOS transistors, so that the circuit scale becomes so large. This circuit necessitates the currents Iss1, Iss2 and the currents of the bias circuits in addition to the idling current of output, thus increasing the electric power consumption. The increase of circuit scale increases a chip layout area and thus increases the electric power consumption, and it in turn results in creating temperature gradient in the chip to degrade Vgs matching characteristics of the MOS transistors. This was a cause of the temperature drift of output offset. In some cases, occurrence of this output offset could make the accurate dc-coupled signal processing difficult in the case of applications to the analog processing. Considering applications to the voltage mode multiple-valued logic circuits, the occurrence of offset in the buffer could considerably degrade the noise margin of multilevel signal processing in some cases.

SUMMARY OF THE INVENTION

An object of the present invention is to provide a semiconductor integrated circuit that permits accurate transmission of signal and high-level integration without increase in the number of circuit elements (the number of elements composing the circuit) and without increase in the electric power consumption.

Another object of the present invention is to provide a semiconductor integrated circuit that is free of the problem of output dc level shift and also free of the occurrence of the output offset voltage due to characteristics of MOS transistor components, particularly, due to the variation of the threshold voltage (Vth).

Still another object of the present invention is to provide a semiconductor integrated circuit that can form a buffer circuit or a voltage hold circuit to improve the noise margin in signal processing.

A further object of the present invention is to provide a semiconductor integrated circuit that can be produced with high yield, readily, and at low cost, that consumes less power, and that occupies a small area.

Another object of the present invention is to provide a semiconductor integrated circuit wherein an input terminal is a gate of a first depletion-mode insulated gate type transistor and an output terminal is a source of said first insulated gate type transistor, wherein a drain of a second depletion-mode insulated gate type transistor having W/L equal to that of the first insulated gate type transistor and having the same conduction type as that of the first insulated gate type transistor is connected to the source of said first insulated gate type transistor, wherein a gate and a source of said second insulated gate type transistor are connected to a lower-voltage-side power-supply potential or a higher-voltage-side power-supply potential, and wherein when a voltage between the gate and the source of said second insulated gate type transistor is 0 V, a drain current of said second insulated gate type transistor is a bias current of said first insulated gate type transistor.

In the present invention, the source follower is constructed of the first and second insulated gate type transistors of the so-called depletion mode where the drain current flows even if the gate and the source are biased at 0 V, and the drain current of the second insulated gate type transistor for constant-current power supply the gate and the source of which are biased at 0 V is used to bias the voltage between the gate and the source of the first insulated gate type transistor for output drive having W/L equal to that of the second insulated gate type transistor for constant-current power supply, to 0 V, whereby the source follower circuit without the dc level shift can be realized with low power consumption and with high accuracy between the input and output while using the minimum number of circuit elements.

Further, the source terminal of each of the insulated gate type transistors forming the semiconductor integrated circuit of the present invention is connected to the well diffusion layer of each transistor, whereby the substrate bias effect is eliminated to achieve the linear input/output characteristics. Particularly, when a buffer with the nonlinear input/output characteristics is used in the voltage mode multilevel signal processing, it will be a cause of degrading the noise margin of signals of multi-valued signal levels. Therefore, high accuracy of multilevel signal processing can be achieved by use of the buffer having the linear input/output characteristics without dc offset.

Further, the insulated gate type transistors forming the semiconductor integrated circuit of the present invention can be suitably selected from depletion-mode N-channel insulated gate type transistors or depletion-mode P-channel insulated gate type transistors.

A further object of the present invention is to provide a semiconductor integrated circuit comprising first, second, and third buffer means each comprised of the semiconductor integrated circuit as described above, wherein an output of said first buffer means is connected through first switch means to an input of said second buffer means and to first capacitor means whose one side is connected to the lower-voltage-side power-supply potential or the higher-voltage-side power-supply potential, wherein an output of said second buffer means is connected through second switch means to an input of said third buffer means and to second capacitor means whose one side is connected to the lower-voltage-side power-supply potential or the higher-voltage-side power-supply potential, said semiconductor integrated circuit comprising a data hold control terminal for controlling on/off of said first switch means and said second switch means in opposite phases to each other, wherein an input of said first buffer means is a signal input and an output of said third buffer means is a signal output.

Namely, the semiconductor integrated circuit of the present invention may be arranged so that sample-and-hold circuits are constructed by connecting one terminal of capacitor means to the lower-voltage-side power-supply potential or the higher-voltage-side power-supply potential and connecting switch means to the other terminal of this capacitor means, the source follower circuit according to the present invention is used as an input buffer, an output of this input buffer is input into the first sample-and-hold circuit, an output of the first sample-and-hold circuit is further connected through the buffer to an input terminal of the second sample-and-hold circuit, and the switch means provided for the respective first sample-and-hold circuit and second sample-and-hold circuit are controlled in opposite phases.

This can realize the master-slave type data latch of analog signal and multilevel signal without the dc level shift in the simple circuit configuration with high accuracy. Particularly, the implementation of the multilevel data latch means makes a multilevel parallel high-speed pipeline process possible.

This can realize the buffer circuit and data latch circuit of low power consumption and high accuracy for analog signal processing and multilevel signal processing, thereby remarkably improving the accuracy of signal processing and the processing speed.

Another object of the present invention is to provide a semiconductor integrated circuit comprising:

a first depletion-mode N-channel insulated gate type transistor and a first depletion-mode P-channel insulated gate type transistor, a gate of each of said transistors being connected to an input terminal and a source of each transistor being connected to an output terminal;

a second depletion-mode N-channel insulated gate type transistor having W/L equal to that of said first depletion-mode N-channel insulated gate type transistor, a drain of said second depletion-mode N-channel insulated gate type transistor being connected to said output terminal and a gate and a source of said second depletion-mode N-channel insulated gate type transistor being connected both to a lower-voltage-side power supply;

a second depletion-mode P-channel insulated gate type transistor having W/L equal to that of said first depletion-mode P-channel insulated gate type transistor, a drain of said second depletion-mode P-channel insulated gate type transistor being connected to said output terminal and a gate and a source of said second depletion-mode P-channel insulated gate type transistor being connected both to a higher-voltage-side power supply.

Namely, according to the present invention, the drain current of the second depletion-mode N-channel insulated gate type MOS transistor (composing a sink type constant-current power supply) whose voltage between the gate and the source is biased at 0 V, biases the gate-source voltage of the first depletion-mode N-channel insulated gate type transistor for output drive at 0 V, and the drain current of the second depletion-mode P-channel insulated gate type transistor (composing a source type constant-current power supply) whose voltage between the gate and the source is biased at 0 V, biases the gate-source voltage of the first depletion-mode P-channel insulated gate type transistor for output drive, at 0 V, whereby the voltage between the gate and the source of the first depletion-mode N-channel insulated gate type transistor and P-channel insulated gate type transistor for output drive is set at 0 V, thus realizing the complementary source follower without the dc level shift and offset between the input and the output. The semiconductor integrated circuit described above permits the complementary source follower without offset to be constructed in the very simple circuit configuration, which can decrease the chip area and further enhance the matching accuracy of device characteristics of the insulated gate type transistors thereby. This can realize the buffer circuit with high accuracy for analog signal processing and multilevel signal processing, thus remarkably enhancing the accuracy of signal processing.

In the semiconductor integrated circuit of the present invention, the source of each insulated gate type transistor is connected to the well diffusion layer of each transistor, whereby the substrate bias effect is eliminated to provide the linear input/output characteristics. Particularly, when the buffer with the nonlinear input/output characteristics is used for the voltage mode multilevel signal processing, it will be a cause of degrading the noise margin of signals of multivalued signal levels. However, use of the semiconductor integrated circuit according to the present invention can realize the high accuracy of multilevel signal processing by use of the buffer having the linear input/output characteristics without dc offset.

"W/L equal" means that values of (channel width)/(channel length) are equal or so close as to be regarded as substantially equal. The point is that W/L values of the insulated gate type transistors are equal and values of W and L are preferably equal but do not always have to be equal.

BRIEF DESCRIPTION OF THE DRAWINGS

FIG. 13 is a schematic cross-sectional view for explaining another preferred example of semiconductor devices forming the circuit shown in FIG. 10.

DETAILED DESCRIPTION OF THE PREFERRED EMBODIMENTS

Embodiments of the present invention will be described in detail by reference to the drawings. Since the MOS transistors are normally used as insulated gate type transistors, the following description will be given with examples of the MOS transistors.

[First Embodiment]

Figure 5:
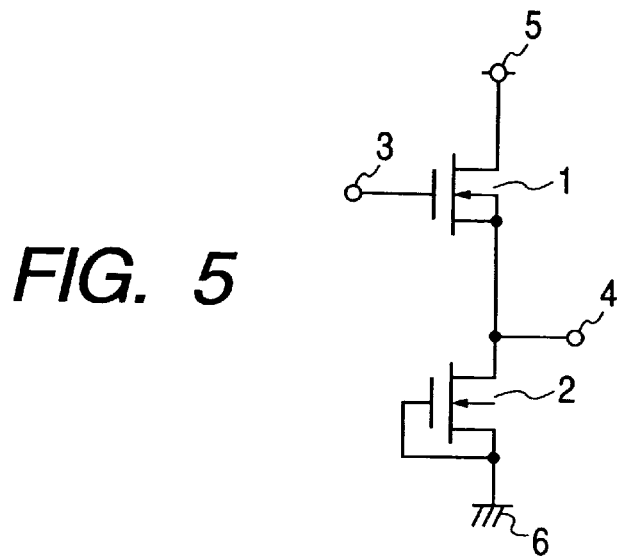
FIG. 5 is a schematic circuit diagram for explaining an example of the semiconductor integrated circuit according to the present invention.

FIG. 5 is a circuit diagram to show the first embodiment of the present invention. In FIG. 5, the gate terminal of a depletion-mode NMOS transistor 1 for output drive is an input terminal 3, the source terminal thereof is an output terminal 4, and the drain terminal thereof is connected to a power-supply voltage 5 (which is a power-supply potential on the higher voltage side). In this configuration, the drain terminal of a depletion-mode NMOS transistor 2 for constant-current power supply is connected to the output terminal 4, and the source terminal and gate terminal of the depletion-mode NMOS transistor 2 for constant-current power supply are connected to the ground potential 6 (which is a power-supply potential on the lower voltage side). In this configuration, the drain current of the depletion-mode NMOS transistor 2 for constant-current power supply is determined to be a current value at an operating point where the gate and the source thereof are biased at 0 V. In the present embodiment W/L of the depletion-mode NMOS transistor 1 for output and W/L of the depletion-mode NMOS transistor 2 for constant-current power supply are equal to each other (here, the point is that values of W/L are equal, whereas values of W, L are preferably equal, but they may be different), whereby electrical characteristics are matched.

Figure 6:
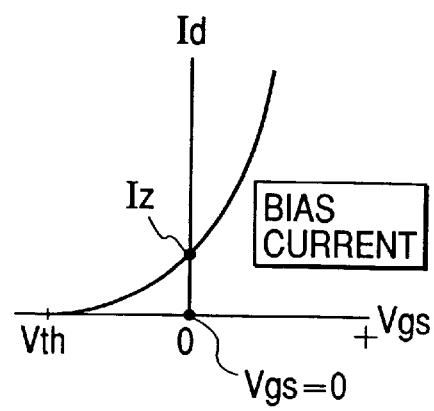
FIG. 6 is a diagram for explaining the dc characteristics of the circuit shown in FIG. 5.

FIG. 6 illustrates Id-Vgs characteristics of the depletion-mode NMOS transistor 1 for output drive and the depletion-mode NMOS transistor 2 for constant-current power supply. Since the gate-source voltage Vgs of the depletion-mode NMOS transistor 2 for constant-current power supply is biased at 0 V, the drain current is Iz shown in FIG. 6. Since this drain current Iz becomes the operating-point current or idling current of the depletion-mode NMOS transistor 1 for output, the gate-source voltage Vgs of the depletion-mode NMOS transistor 1 for output is set at 0 V as the result. This means that the source follower circuit can be constructed without the dc level shift between the source and the drain.

During driving of a load, in the case of the sink current load, the drain terminal of the depletion-mode NMOS transistor 2 for constant-current power supply draws the load driving current; in the case of the source current load, the load driving current is delivered from the drain terminal through the source terminal of the depletion-mode NMOS transistor 1 for output. Since the input terminal 3 is the gate terminal in this configuration, the signal from the preceding stage is received at high impedance; since the output terminal 4 is the source terminal, the load circuit of the subsequent stage can be driven at low impedance. In this way the source follower circuit can be realized without the dc level shift between the input and the output at high speed.

In the circuit shown in FIG. 5, the substrate terminal and source terminal of each MOS transistor are electrically connected in order to eliminate the substrate bias effect of MOS transistor to achieve the linear input/output characteristics. Namely, potentials of the source terminal and the well diffusion area are equal. This is particularly because use of a buffer with nonlinear input/output characteristics in voltage mode multilevel signal processing becomes a cause of degrading the noise margin of signals of multi-valued signal levels. Thus, the accuracy of multilevel signal processing can be enhanced by using the buffer having the linear input/output characteristics without the dc offset.

Figure 1:
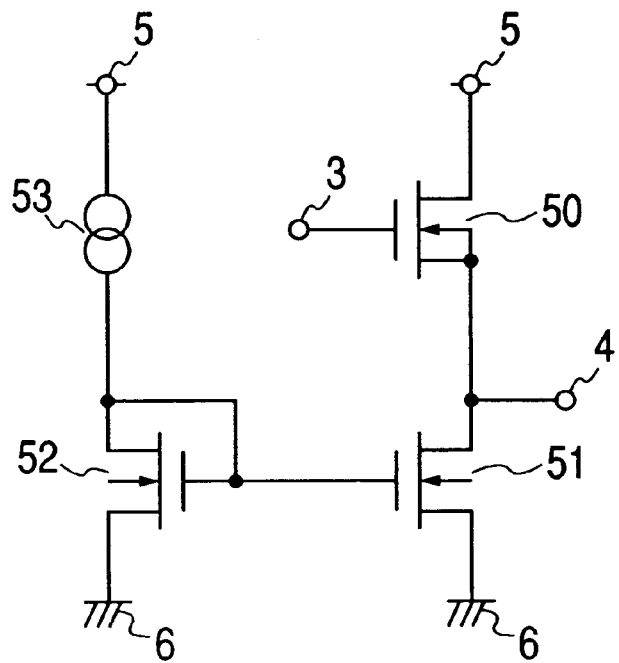
FIG. 1 is a schematic circuit diagram to show an example of the source follower circuit.
Figure 2:
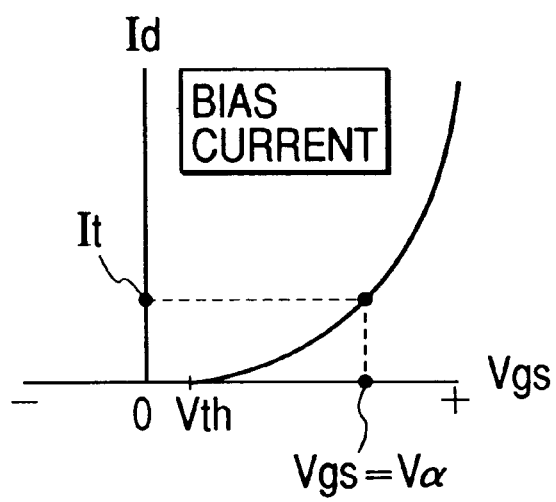
FIG. 2 is a diagram for explaining the dc characteristics of the source follower circuit of FIG. 1.
Figure 3:
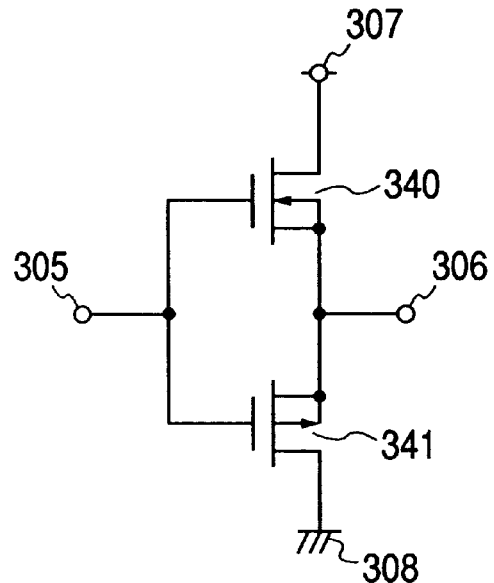
FIG. 3 is a schematic circuit diagram to show an example of the complementary source follower circuit.

In the circuit described referring to FIG. 1, Vgs, the so-called dc level shift between input and output, had the variation distribution because of the principal factors including the manufacturing variations of Vth of MOS and the setting variations of the idling current due to the mismatch of current mirror of the current mirror circuit for constant-current power supply. In the present embodiment, however, the dc level shift of the circuit is determined by the relative matching accuracy between the depletion-mode NMOS transistor 1 for output and the depletion-mode NMOS transistor 2 for constant-current power supply. Therefore, the transistors can be located close to each other on a chip, the dc level shift is irrespective of variations in the absolute value of Vth, and only one transistor, the depletion-mode NMOS transistor 2 for constant-current power supply, can form the constant-current power supply. The present embodiment does not necessitate the current mirror circuit and permits highly accurate current setting. This permits Vgs of the depletion-mode NMOS transistor 1 for output to be set at 0 V with high accuracy, thus enabling the dc signal transmission with high accuracy. Since Vgs can be set at 0 V irrespective of the variations of Vth in the manufacturing process as described above, semiconductor apparatus can be produced with high yield and at low cost. Since the present embodiment does not need the bias circuit etc. and can be constructed of only two devices, the circuit can operate with low power consumption and can be constructed in high integration.

The present embodiment can also decrease the circuit scale, so as to decrease the chip layout area, and decrease the power consumption, so as to increase degrees of freedom in placement of devices in the chip, decrease the temperature gradient due to heat generation, improve Vgs matching characteristics of MOS transistors, and also drastically improve the temperature drift of output offset. This permits accurate signal processing of dc coupling to be achieved stably in the case of applications to the analog processing; in the case of applications to the voltage mode multiple-valued logic circuits, occurrence of offset is suppressed in the buffer, whereby the noise margin in the multilevel signal processing can be improved drastically.

When many circuits according to the present embodiment are used on one chip, the chip size can be decreased, of course, because of the decrease in the number of devices, and the power consumption can also be decreased, whereby the temperature gradient is decreased in the chip and the matching characteristics of devices are further improved. Therefore, the chip can be fabricated with high yield while covering the manufacturing variation range of Vth of MOS.

[Second Embodiment]

Figure 7:
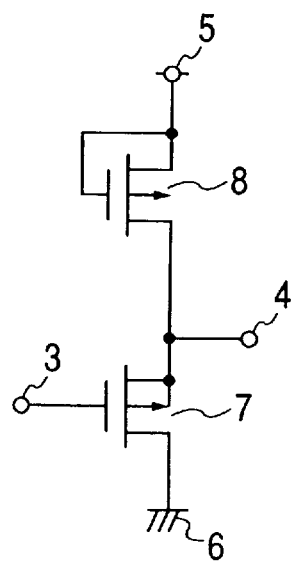
FIG. 7 is a schematic circuit diagram for explaining another example of the semiconductor integrated circuit according to the present invention.

FIG. 7 is a circuit diagram to show the second embodiment of the present invention. In FIG. 7, the gate terminal of a depletion-mode PMOS transistor 7 for output drive is the input terminal 3, the source terminal thereof is the output terminal 4, and the drain terminal thereof is connected to the ground potential 6. In this configuration, the drain terminal of a depletion-mode PMOS transistor 8 for constant-current power supply is connected to the output terminal 4, and the source terminal and gate terminal of the depletion-mode PMOS transistor 8 for constant-current power supply are connected to the power-supply voltage 5. In this configuration the drain current of the depletion-mode PMOS transistor 8 for constant-current power supply is determined to be the current at the operating point where the gate and source thereof are biased at 0 V. In the present embodiment W/L of the depletion-mode PMOS transistor 7 for output and W/L of the depletion-mode PMOS transistor 8 for constant-current power supply are equal, thus matching the electrical characteristics thereof.

Figure 8:
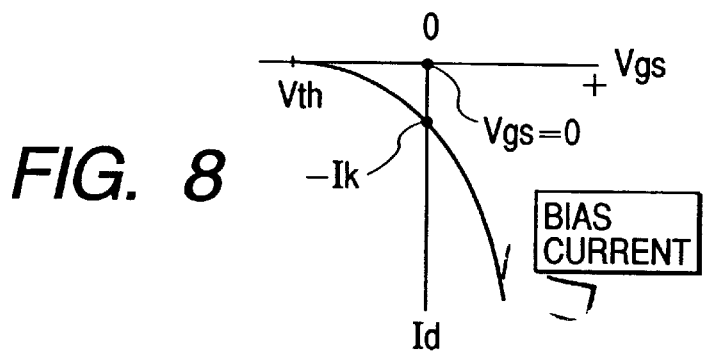
FIG. 8 is a diagram for explaining the dc characteristics of the circuit shown in FIG. 7.

FIG. 8 illustrates the Id-Vgs characteristics of the depletion-mode PMOS transistor 7 for output drive and the depletion-mode PMOS transistor 8 for constant-current power supply. Since the gate-source voltage Vgs of the depletion-mode PMOS transistor 8 for constant-current power supply is biased at 0 V, the drain current is −Ik shown in FIG. 8. Since this drain current −Ik becomes the operating point current or idling current of the depletion-mode PMOS transistor 7 for output drive, the gate-source voltage Vgs of the depletion-mode PMOS transistor 7 for output is set at 0 V. Namely, the source follower circuit can be realized without the dc level shift between the source and the drain. During driving of a load, in the case of the sink current load, the drain terminal of the depletion-mode PMOS transistor 8 for constant-current power supply draws the load driving current; in the case of the source current load, the load driving current is delivered from the drain terminal through the source terminal of the depletion-mode PMOS transistor 7 for output. Since the input terminal 3 is the gate terminal in this configuration, the signal from the preceding stage is received at high impedance; since the output terminal 4 is the source terminal, the load circuit of the subsequent stage can be driven at low impedance. In this way the source follower circuit can be realized without the dc level shift between the input and output at high speed.

In order to eliminate the substrate bias effect of MOS transistor to achieve the linear input/output characteristics, the substrate terminal and source terminal of each MOS transistor are electrically connected. Namely, the potentials of the source terminal and the well diffusion area are equal. This is particularly because use of a buffer with nonlinear input/output characteristics in the voltage mode multilevel signal processing causes degradation of the noise margin of signals of multi-valued signal levels. Therefore, highly accurate multilevel signal processing can be realized by using the buffer having the linear input/output characteristics without the dc offset.

In the circuit described referring to FIG. 1, Vgs, the so-called dc level shift between input and output, had the variation distribution because of the principal factors including the manufacturing variations of Vth of MOS and the setting variations of the idling current due to the mismatch of current mirror of the current mirror circuit for constant-current power supply, as described previously.

In the present embodiment, however, the dc level shift of the circuit is determined by the relative matching accuracy of the depletion-mode PMOS transistor 7 for output and the depletion-mode PMOS transistor 8 for constant-current power supply. Therefore, they can be located close to each other on the chip, the dc level shift is regardless of the variations of absolute value of Vth, and the constant-current power supply can be constructed of only one transistor, the depletion-mode PMOS transistor 8 for constant-current power supply. Therefore, the present embodiment does not necessitate the current mirror circuit and permits highly accurate current setting. This permits Vgs of the depletion-mode PMOS transistor 7 for output to be set at 0 V with high accuracy, thus enabling the dc signal transmission with high accuracy. Since Vgs can be set at 0 V irrespective of the variations of Vth in the manufacturing process as described above, the semiconductor apparatus can be produced with high yield and at low cost. Since the present embodiment does not necessitate the bias circuit etc. and can be constructed of only two devices, the present embodiment achieves low power consumption and high integration.

The present embodiment can also decrease the circuit scale, so as to decrease the chip layout area, and decrease the power consumption, so as to increase degrees of freedom in placement of devices in the chip, decrease the temperature gradient due to heat generation, improve the Vgs matching characteristics of MOS transistors, and also drastically improve the temperature drift of output offset. This permits accurate signal processing of dc coupling to be achieved stably in the case of applications to the analog processing; in the case of applications to the voltage mode multiple-valued logic circuits, occurrence of offset is suppressed in the buffer, whereby the noise margin in the multilevel signal processing can be improved drastically.

When many circuits according to the present embodiment are used on one chip, the chip size can be decreased, of course, because of the decrease in the number of devices, and the power consumption can also be decreased, whereby the temperature gradient is decreased in the chip and the matching characteristics of devices are further improved. Therefore, the chip can be fabricated with high yield while covering the manufacturing variation range of Vth of MOS.

[Third Embodiment]

Figure 9:
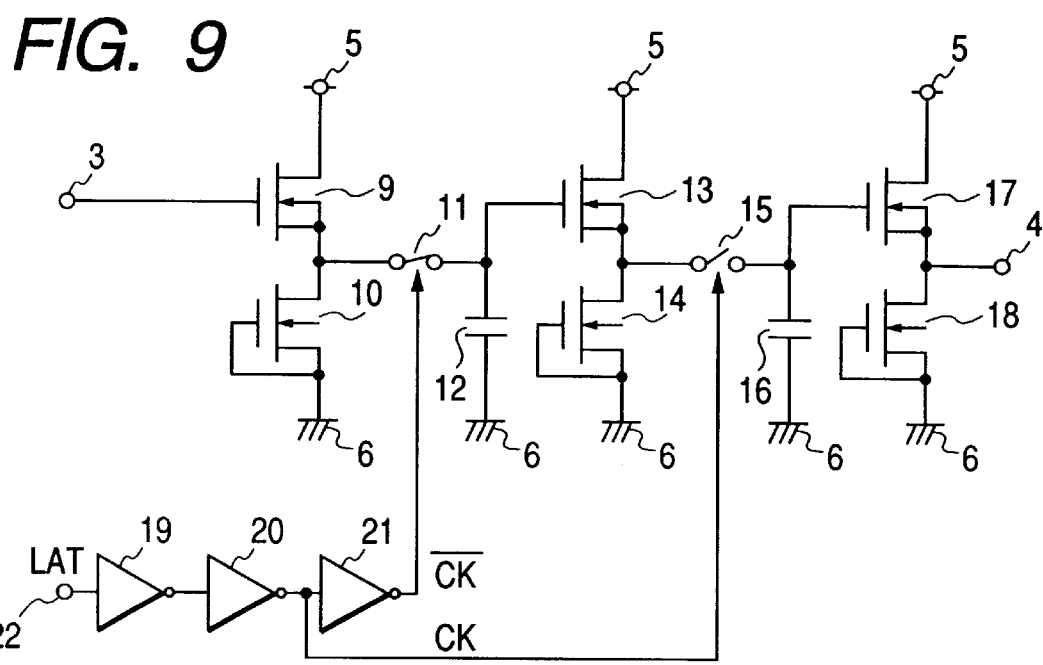
FIG. 9 is a schematic circuit diagram for explaining another example of the semiconductor integrated circuit according to the present invention.

FIG. 9 is a circuit diagram to show the third embodiment of the present invention.

In FIG. 9, the gate terminal of a depletion-mode NMOS transistor 9 constituting an input buffer is the input terminal 3, the drain terminal thereof is connected to the power-supply voltage 5, and the source terminal thereof is connected to the drain terminal of a depletion-mode NMOS transistor 10 to form an output of the input buffer to be input into a first switch 11. One side of the first switch 11 is connected to a first capacitor 12 and to the gate terminal of a depletion-mode NMOS transistor 13 composing a master latch. The drain terminal of the depletion-mode NMOS transistor 13 is connected to the power-supply voltage 5, the source terminal thereof is connected to the drain terminal of a depletion-mode NMOS transistor 14 to form an output of the master latch to be input into a second switch 15. One side of the second switch 15 is connected to a second capacitor 16 and to the gate terminal of a depletion-mode NMOS transistor 17 forming a slave latch. The drain terminal of the depletion-mode NMOS transistor 17 is connected to the power-supply voltage 5, and the source terminal thereof is connected to the drain terminal of a depletion-mode NMOS transistor 18, thus becoming an output 4 of the slave latch and the present embodiment. The depletion-mode NMOS transistors 10, 14, 18 work as a constant-current power supply and the gate and source terminals of each transistor are connected to the ground potential 6. Therefore, the gate-source voltage of the depletion-mode NMOS transistors 10, 14, 18 is biased at 0 V, and the drain current is thus determined. The first and second switches 11, 15 are controlled by an LAT signal of control input terminal 22. The LAT signal is connected to an input of inverter 19, an output of inverter 19 is connected to an input of inverter 20, and an output of the inverter 20 is connected to an input of inverter 21 and to a control terminal of the second switch 15. The output of inverter 21 is connected to a control terminal of the first switch 11. Suppose that the first and second switches 11, 15 become on when the control terminal thereof is H but off when L. When the LAT signal, which is a control signal applied to the control input terminal 22, is H, the first switch 11 is off while the second switch 15 is on. When the LAT signal is L, the first switch 11 is on while the second switch 15 is off. The master latch, composed of the depletion-mode NMOS transistors 13, 14 and the first capacitor 12, holds a multilevel signal applied to the input terminal 3 at a rise edge of a waveform when the LAT signal transitions from L to H. The slave latch, composed of the depletion-mode NMOS transistors 17, 18 and the second capacitor 16, holds the multilevel signal applied to the input terminal 3 at a rise edge of a waveform when the LAT signal transitions from H to L. Based on this operation, the master latch and slave latch operate to capture and hold multilevel data at a rise edge when the LAT signal transitions from H to L. The logic can be changed to one for holding the multilevel signal at a fall edge when the LAT signal transitions from L to H, by connecting the output of inverter 20 to the control terminal of the first switch 11 and connecting the inverter 21 to the control terminal of the second switch 15. Since the depletion-mode NMOS transistors 9, 13, 17, which are the MOS transistors for follower forming the input buffer, master latch, and slave latch, have the drain current set so that the gate-source voltage is 0 V, as described in the first embodiment of the present invention, the data latching of multilevel signals can be realized in the very simple circuit configuration without the dc level shift between the input terminal 3 and the output terminal 4, thus permitting a large-scale multilevel integrated circuit to be constructed. Since accurate holding and transmission of multilevel signal can be performed, a pipeline process of multilevel signal can be carried out, so that a high-speed multilevel arithmetic system can be realized. Since the noise margin in processing of multilevel signal is improved drastically, the radix of multilevel signal can be increased and the number of wires between circuits can be decreased largely, whereby LSI of higher integration can be achieved as compared with a system of binary digital configuration, also including the simple circuit configuration.

[Fourth Embodiment]

Figure 10:
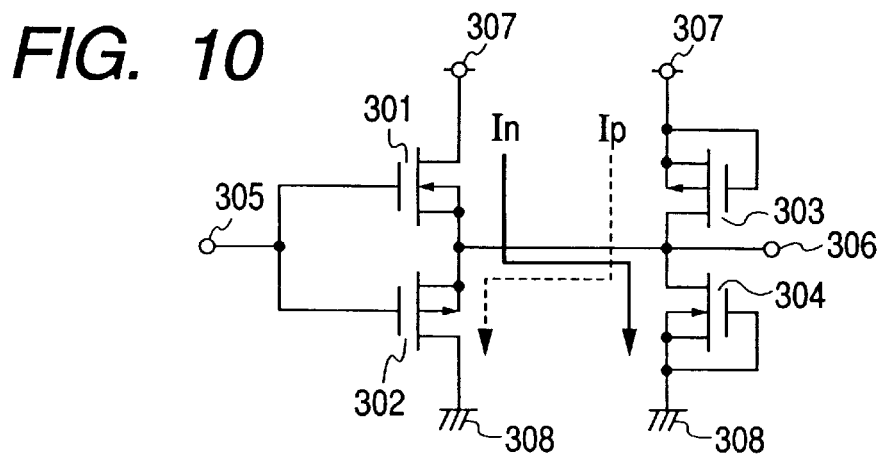
FIG. 10 is a schematic circuit diagram for explaining another example of the semiconductor integrated circuit according to the present invention.

FIG. 10 is a circuit diagram to show an embodiment of the present invention. In FIG. 10, the gate terminals of respective depletion-mode NMOS transistor 301 and depletion-mode PMOS transistor 302 are connected to each other to be connected to the input terminal 305, the source terminals of the respective transistors are connected to each other to be connected to the output terminal 306, the drain terminal of the depletion-mode NMOS transistor 301 is connected to the power-supply voltage 307 (which is the power-supply voltage on the higher voltage side), the drain terminal of the depletion-mode PMOS transistor 302 is connected to the ground potential 308 (which is the power-supply potential on the lower voltage side), and the load driving current is delivered from the drain terminal through the source terminal. Since the input terminal 305 is the gate terminals of the two transistors in this configuration, the signal from the preceding stage is received at high impedance; since the output terminal 306 is the source terminals of the two transistors, the load circuit of the subsequent stage can be driven at low impedance. In order to eliminate the substrate bias effect of MOS transistor to achieve the linear input/output characteristics, the substrate terminal and source terminal of each of the depletion-mode NMOS transistor 301 and depletion-mode PMOS transistor 302 are electrically connected. Namely, the substrate bias effect is canceled by equaling the source potential of each MOS transistor to the potential of the well diffusion area.

Further, the drain terminal of a depletion-mode NMOS transistor 304, which has the same W/L as the depletion-mode NMOS transistor 301, is connected to the output terminal 306, and the gate and source terminals of the depletion-mode NMOS transistor 304 are connected both to the ground potential 308. The depletion-mode NMOS transistor 304 operates as a sink type constant-current power supply In having the output of the drain terminal of the depletion-mode NMOS transistor whose gate and source are biased at 0 V. The drain terminal of a depletion-mode PMOS transistor 303, which has the same W/L as the depletion-mode PMOS transistor 302, is connected to the output terminal 306, and the gate and source terminals of the depletion-mode PMOS transistor 303 are connected both to the power-supply voltage 307. The depletion-mode PMOS transistor 303 operates as a source type constant-current power supply Ip having the output of the drain terminal of the depletion-mode PMOS transistor 303 whose voltage between the gate and the source is biased at 0 V. The sink type constant-current power supply In, which is the depletion-mode NMOS transistor 304 whose voltage between the gate and the source is biased at 0 V, biases the gate-source voltage of the depletion-mode NMOS transistor 301 for output drive forming the source follower at 0 V, and the source type constant-current power supply Ip, which is the depletion-mode PMOS transistor 303 whose voltage between the gate and the source is biased at 0 V, biases the gate-source voltage of the depletion-mode PMOS transistor 302 for output drive forming the source follower at 0 V, whereby the gate-source voltages of the both depletion-mode NMOS transistor 301 and depletion-mode PMOS transistor 302 for output drive are biased at 0 V. This makes it possible to construct the complementary source follower without the dc level shift and offset between input and output.

Using the complementary source follower configuration, the present embodiment allows high-speed waveform driving in such a way that the NMOS transistor 301 delivers the load driving source current when the current flows from the output terminal 306 to the load or in such a way that the PMOS transistor 302 delivers the load driving sink current when the current flows from the load to the output terminal 306, whereby a transient charge current at a rise and at a fall of waveform can be delivered to a load of large capacity.

The mechanism for canceling variations of the threshold voltage Vth between NMOS and PMOS to prevent occurrence of offset in the present embodiment will be described referring to the characteristic diagrams of FIG. 11A, FIG. 11B, and FIG. 11C. Let us suppose that the ratios W/L of NMOS and PMOS in this description are set so that a difference in mobility between NMOS and PMOS is adjusted by the W/L ratios so as to equal gm (trans conductance) of the both MOSs. It is a matter of course that the present invention imparts no specific limitation on the W/L ratios between NMOS and PMOS but rather can be realized at arbitrary W/L ratios.

Figure 11A:
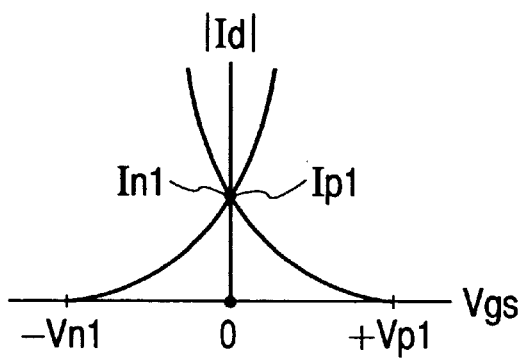
FIG. 11A, FIG. 11B, and FIG. 11C are diagrams for explaining the dc characteristics of the circuit shown in FIG. 10.

The characteristic diagram of FIG. 11A shows the case of |Vn1|=|Vp1| where the absolute value of the threshold voltage Vn1 of the depletion-mode NMOS transistor 301 is equal to that of the threshold voltage Vp1 of the depletion-mode PMOS transistor 302. Since the gate-source voltage of the depletion-mode NMOS transistor 304 and the depletion-mode PMOS transistor 303 is biased at 0 V, the output drain current of each transistor is set to be In1=Ip1 shown in FIG. 11A. Namely, the sink type constant-current power supply In attached to the output terminal 306 is set to In1, while the source type constant-current power supply Ip to Ip1, wherein the both current values are equal. In1 determines the operating point of the depletion-mode NMOS transistor 301, while Ip1 determines the operating point of the depletion-mode PMOS transistor 302. Since W/L of the depletion-mode NMOS transistor 301 is equal to that of the depletion-mode NMOS transistor 304, the gate-source voltage of the depletion-mode NMOS transistor 301 biased by In1 is set at 0 V. Since W/L of the depletion-mode PMOS transistor 302 is equal to that of the depletion-mode PMOS transistor 303, the gate-source voltage of the depletion-mode PMOS transistor 302 biased by Ip1 is set at 0 V. Therefore, the voltage between the input terminal 305 and the output terminal 306 of the complementary source follower circuit in the present embodiment is biased at 0 V.

Figure 11B:
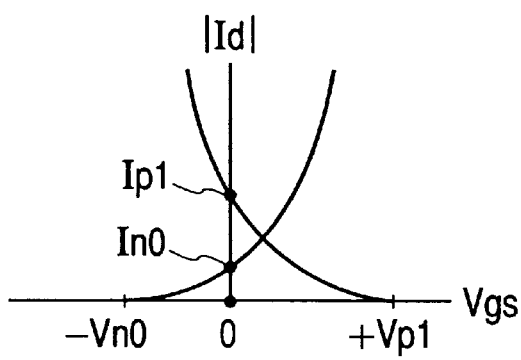

The characteristic diagram of FIG. 11B shows the case of |Vn0|<|Vp1| where the absolute value of the threshold voltage Vn0 of the depletion-mode NMOS transistor 301 is smaller than that of the threshold voltage Vp1 of the depletion-mode PMOS transistor 302. Since the gate-source voltage of the depletion-mode NMOS transistor 304 and the depletion-mode PMOS transistor 307 is biased at 0 V, the output drain currents of the respective transistors are In0<Ip1 shown in FIG. 11B. Since W/L of the depletion-mode NMOS transistor 301 is equal to that of the depletion-mode NMOS transistor 304, the gate-source voltage of the depletion-mode NMOS transistor 301 biased by In0 is set at 0 V. Since W/L of the depletion-mode PMOS transistor 302 is equal to that of the depletion-mode PMOS transistor 303, the gate-source voltage of the depletion-mode PMOS transistor 302 biased by Ip1 is set at 0 V. Namely, even if there occurs the relative difference of Vth between NMOS and PMOS, the voltage between the input terminal 305 and the output terminal 306 of the complementary source follower circuit in the present embodiment is biased at 0 V.

Figure 11C:
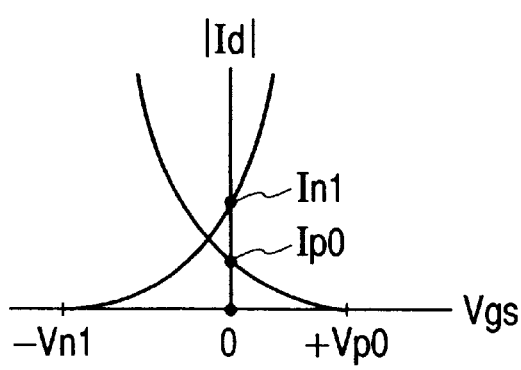

In the case where |Vn1|>|Vp0| and In1>Ip0, as shown in FIG. 11C, the gate-source voltage of the depletion-mode NMOS transistor 301 biased by In1 is set at 0 V and the gate-source voltage of the depletion-mode PMOS transistor 302 biased by Ip0 is also set at 0 V, similarly. Therefore, even if there occurs the relative difference of Vth between NMOS and PMOS, the voltage between the input terminal 305 and the output terminal 306 of the complementary source follower circuit in the present embodiment is biased at 0 V.

Figure 4:
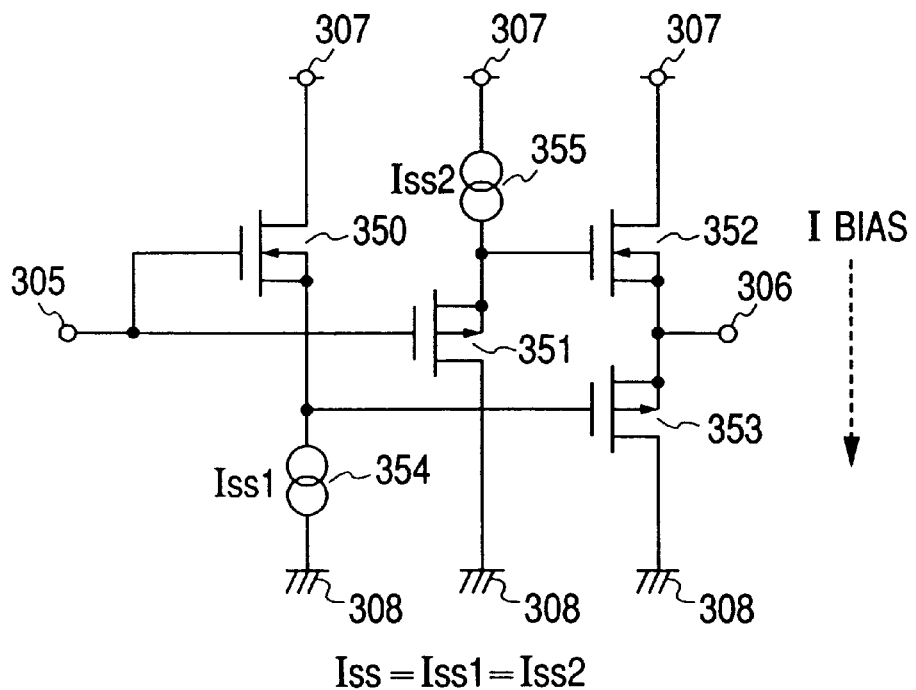
FIG. 4 is a schematic circuit diagram to show another example of the complementary source follower circuit.

As described above in the present embodiment, no offset voltage appears at the output terminal 306 of the complementary source follower even with occurrence of relative difference of threshold voltage Vth between NMOS and PMOS, thereby permitting accurate transmission of dc voltage. In the case of the circuit of FIG. 4 having the difference canceling function of Vth between NMOS and PMOS, the idling current Ibias flowing between the NMOS transistor 352 and PMOS transistor 353 forming the output drive stage is determined by the dc potential difference between the sources of the two source followers, the NMOS source follower composed of the NMOS transistor 350 and the constant-current power supply 354 having the value of Iss1 and the PMOS source follower composed of the PMOS transistor 351 and the constant-current power supply 355 having the value of Iss2, so that the circuit necessitates the currents of Iss1 and Iss2 in addition to the idling current Ibias; in the present embodiment, either the source type constant-current power supply Ip whose output is the drain terminal of the depletion-mode PMOS transistor 303 or the sink type constant-current power supply In whose output is the drain terminal of the depletion-mode NMOS transistor 304, directly becomes the idling current of the circuit of the present embodiment shown in FIG. 10, so that no extra current needs to flow, thus achieving the output buffer of low power consumption. The source type constant-current power supply Ip whose output is the drain terminal of the depletion-mode PMOS transistor 303 and the sink type constant-current power supply In whose output is the drain terminal of the depletion-mode NMOS transistor 304, can be set simply by shorting (at 0 V) of the gate and the source, utilizing the characteristics of the depletion-mode MOS transistors, and no dedicated bias circuit is necessitated. In the case of the current source composed of the current mirror circuit, it needed the current supply circuit as a reference and the MOS transistors for current supply with their gate in common, but the constant-current power supply of depletion-mode MOS adopted in the present embodiment can compose a constant-current power supply of only one transistor without any bias circuit. Therefore, the present embodiment can decrease the number of circuit devices and realize low power consumption.

The present embodiment can also decrease the circuit scale, so as to decrease the chip layout area, and decrease the power consumption, so as to increase degrees of freedom in placement of devices in the chip, decrease the temperature gradient due to heat generation, improve the Vgs matching characteristics of MOS transistors, and also drastically improve the temperature drift of output offset. This permits accurate signal processing of dc coupling to be achieved stably in the case of applications to the analog processing; in the case of applications to the voltage mode multiple-valued logic circuits, occurrence of offset is suppressed in the buffer, whereby the noise margin in the multilevel signal processing can be improved drastically.

When many circuits according to the present embodiment are used on one chip, the chip size can be decreased, of course, because of the decrease in the number of devices, and the power consumption can also be decreased, whereby the temperature gradient is decreased in the chip and the matching characteristics of devices are further improved. Therefore, the chip can be fabricated with high yield while covering the manufacturing variation range of Vth of MOS.

Figure 12:
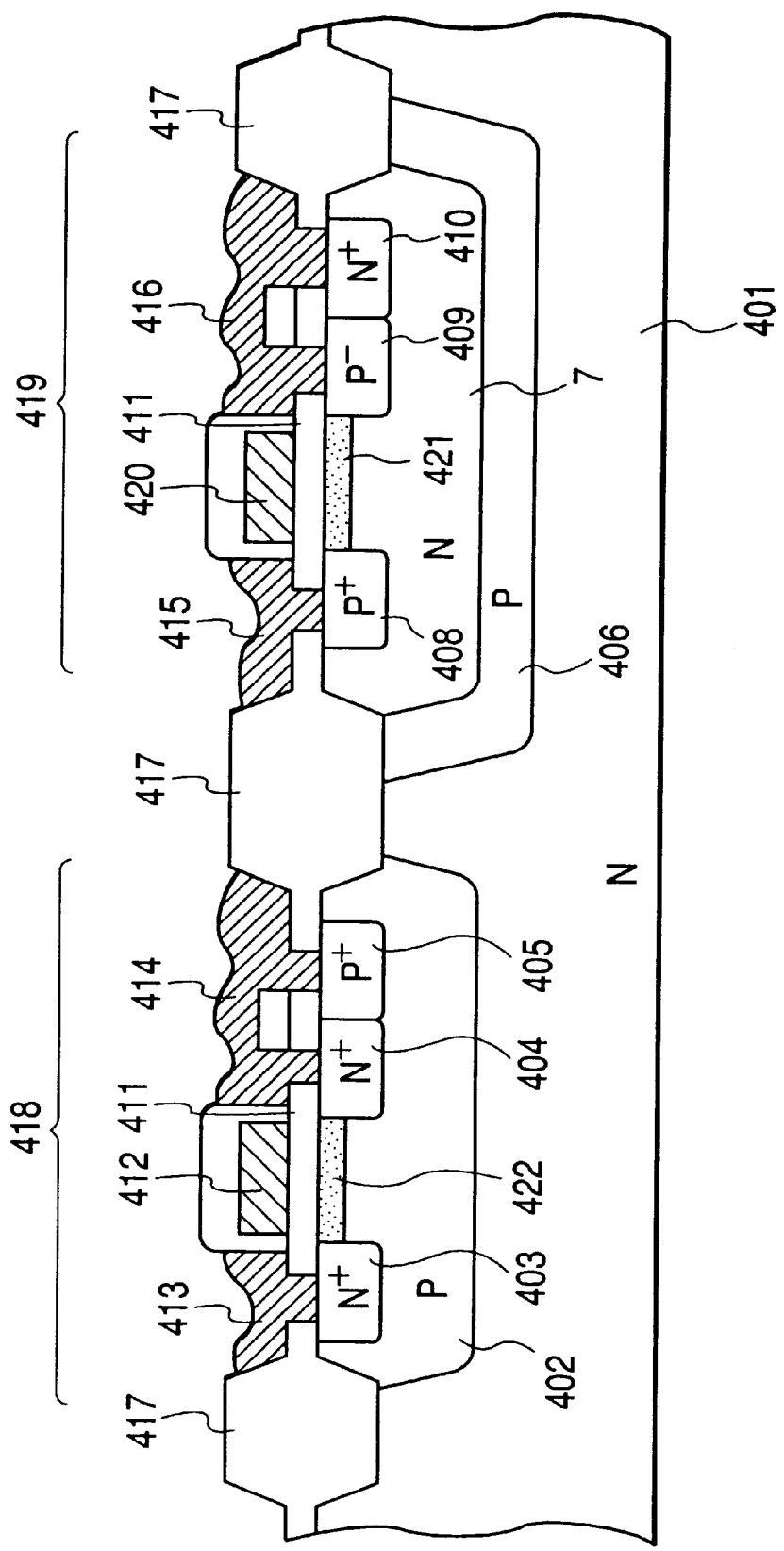
FIG. 12 is a schematic cross-sectional view for explaining a preferred example of semiconductor devices forming the circuit shown in FIG. 10.

FIG. 12 is a cross-sectional view to show a structural example of the semiconductor devices forming the circuit of the present embodiment. In FIG. 12, reference numeral 418 designates the first and second depletion-mode NMOS transistors (which are N-channel insulated gate transistors), 419 the first and second depletion-mode PMOS transistors (which are P-channel insulated gate transistors), 401 an N-type semiconductor substrate, 402 a P-well of the NMOS region, 403 an N$^+$-drain diffusion region, 404 an N$^+$-source diffusion region, 405 a P$^+$-diffusion region for taking the potential of the P-well region, 422 a channel diffusion region for adjustment of threshold, 406 a floating P-well of the PMOS region, 407 an N-well, 408 a P$^+$-drain diffusion region, 409 a P$^+$-source diffusion region, 410 an N$^+$-diffusion region for taking the potential of the N-well region, 421 a channel diffusion region for adjustment of threshold, 411 a gate oxide film of each MOS transistor, 412 polysilicon for a gate wire of the NMOS transistors, 420 polysilicon for a gate wire of the PMOS transistors, and 417 a selectively oxidized film.

In the NMOS transistors and PMOS transistors used in this structural example, the source potential of each transistor is equal to the well potential in order to eliminate the substrate bias effect. Namely, the source diffusion region 404 of the NMOS transistor 418 is connected to the P$^+$-diffusion region 405 in the P-well forming the NMOS transistor 418, by aluminum wire 414. The source diffusion region 409 of the PMOS transistor 419 is also connected to the N$^+$-diffusion region 410 in the N-well forming the PMOS transistor 419, by aluminum wire 416.

FIG. 13 is a sectional view to show another structural example of the semiconductor devices constituting the circuit of the present embodiment. The present structural example is an example in which the circuit is formed in the semiconductor layers provided on an insulating surface. In FIG. 13, numeral 100 designates an insulating substrate, and NMOS transistor 112 and PMOS transistor 113 are formed on the substrate. In the portion forming the NMOS transistor 112, numerals 101, 103 denote N$^+$-diffusion regions to form the drain and source regions, 102 P$^-$-silicon to form a channel, 108 a gate oxide film, and 107 polysilicon of gate. In the portion forming the PMOS transistor 113, numerals 104, 106 denote P$^+$-diffusion regions to form the drain and source regions, 105 N$^-$-silicon to form a channel, 109 a gate oxide film, and 110 polysilicon of gate. Numeral 111 represents an insulating film and 114 wires. The insulating substrate 100 is selected from a sapphire substrate, a silicon oxide film (SiO$_2$), and so on.

As detailed above, the present invention realizes the voltage buffer without the dc level shift by the configuration wherein the output terminal of the source follower circuit composed of the depletion-mode transistor for output buffer of one conduction type is connected to the drain of the depletion-mode transistor for constant-current power supply having the same conduction type as the mentioned one conduction type and the same W/L whereby the voltage between the input and output of the source follower circuit is biased at 0 V, thereby permitting the analog signal processing and multilevel signal processing systems that can accurately transmit dc voltage information.

Further, the source follower without the dc level shift is constructed in the very simple circuit setup, it decreases the chip area and the temperature gradient due to heat generation in the chip with decrease in power consumption, so as to further enhance the matching accuracy of device characteristics of MOS transistors, and this realizes the buffer circuit capable of highly accurate analog signal processing and multilevel signal processing, thus permitting considerable improvement in the accuracy of signal processing.

Further, the source electrode of each MOS transistor is connected to the well diffusion layer of each transistor, whereby the substrate bias effect is eliminated, so as to achieve the linear input/output characteristics. This allows use of the buffer having the linear input/output characteristics without the dc offset, thus drastically improving the noise margin of signal in the multilevel signal processing.

Further, the present invention realizes the data latch of multilevel signal by the very simple circuit configuration and with accuracy, so as to permit the pipeline process of multilevel signal, thus realizing the high-speed multilevel arithmetic system. The breakthrough improvement in the noise margin in the processing of multilevel signal permits increase in the radix of multilevel signal, so as to largely decrease the number of wires between circuits, thus realizing LSI of higher integration than the system of the binary digital configuration, also including the simple circuit configuration.

The present invention can also realize the voltage buffer without the dc level shift by the configuration where the output terminal of the complementary source follower circuit composed of the depletion-mode transistors is connected to the N-channel insulated gate type transistor and the P-channel insulated gate type transistor for constant-current power supply which have the same W/L as that of the N-channel insulated gate type transistor and the P-channel insulated gate type transistor forming the complementary source follower and whose voltage between the gate and the source is biased at 0 V, whereby the voltage between the input and output of the complementary source follower is biased at 0V. This makes it possible to provide the analog signal processing and multilevel signal processing circuits that can accurately transmit the dc voltage information.

Further, the complementary source follower without the dc level shift is constructed of the very simple circuit, whereby the matching accuracy of device characteristics of the insulated gate type transistors can be further enhanced with decrease in the chip area and with decrease in the temperature gradient due to heat generation in the chip because of the low power consumption. This realizes the buffer circuit with high accuracy of analog signal processing and multilevel signal processing, thus remarkably improving the accuracy of signal processing.

Further, the source of each insulated gate type transistor is connected to the well diffusion layer of each transistor, whereby the substrate bias effect is eliminated, so as to achieve the linear input/output characteristics. This permits use of the buffer having the linear input/output characteristics without the dc offset, thus drastically improving the noise margin of signal in the multilevel signal processing.

It should be noted that the present invention is by no means intended to be limited to the above embodiments, but various modifications and combinations can be contemplated as occasion may demand, within the spirit and scope of the present invention.

What is claimed is:

1. A semiconductor integrated circuit comprising, first, second, and third buffer means each comprised of a semiconductor integrated sub-circuit wherein an input terminal of said sub-circuit is coupled to the gate of a first depletion-mode insulated gate type transistor, an output terminal of said sub-circuit is coupled to the source of said first insulated gate type transistor, and the drain of said first insulated gate type transistor is connected to a lower-voltage-side power-supply-potential or a higher-voltage-side power-supply potential, and wherein the drain of a second depletion-mode insulated gate type transistor having a ratio of channel width and channel length, W/L, equal to that of the first insulated gate type transistor and having the same conduction type as that of the first insulated gate type transistor is connected to the source of said first insulated gate type transistor, wherein the gate and the source of said second insulated gate type transistor are connected to a lower-voltage-side power-supply-potential or a higher-voltage-side power-supply potential, and wherein when a voltage between the gate and the source of said second insulated gate type transistor is 0V, a drain current of said second insulated gate type transistor is a bias current of said first insulated gate type transistor, wherein an output of said first buffer means is connected through a first switch means to an input of said second buffer means and to a first capacitor means whose one side is connected to the lower-voltage-side power-supply potential or the higher-voltage-side power-supply potential, wherein an output of said second buffer means is connected through second switch means to an input of said third buffer means and to a second capacitor means whose one side is connected to the lower-voltage-side power-supply potential or the higher-voltage-side power-supply potential, said semiconductor integrated circuit comprising a data hold control terminal for controlling the on/off state of said first switch means and said second switch means in opposite phases to each other, wherein the input of said first buffer means is a signal input and the output of said third buffer means is a signal output.

2. The semiconductor integrated circuit according to claim 1, wherein in the sub-circuit said first and second insulated gate type transistors are N-channel insulated gate type transistors.

3. The semiconductor integrated circuit according to claim 1, wherein in the sub-circuit said first and second insulated gate type transistors are P-channel insulated gate type transistors.

4. The semiconductor integrated circuit according to claim 1, wherein when said data hold control terminal is unactivated, said first switch means is switched on and said second switch means is switched off.

5. The semiconductor integrated circuit according to claim 1, wherein when said data hold control terminal is activated, said first switch means is switched off and said second switch means is switched on.

6. The semiconductor integrated circuit according to claim 1, wherein in the sub-circuit said lower-voltage-side power-supply potential or the higher-voltage-side power-supply potential is the ground potential.

7. The semiconductor integrated circuit according to claim 1, wherein in the sub-circuit a drain of said first insulated gate type transistor is connected to a power supply.

* * * * *

UNITED STATES PATENT AND TRADEMARK OFFICE
CERTIFICATE OF CORRECTION

PATENT NO.     : 6,127,857
DATED          : October 3, 2000
INVENTOR(S)    : KATSUHISA OGAWA ET AL.

It is certified that error appears in the above-identified patent and that said Letters Patent is hereby corrected as shown below:

ON THE COVER PAGE

Under Column [54], "OUTPUT BUFFER OR VOLTAGE HOLD FOR ANALOG OF MULTILEVEL PROCESSING" should read --OUTPUT BUFFER OR VOLTAGE HOLD FOR ANALOG OR MULTILEVEL PROCESSING--;

COLUMN 1

Line 2, "OF" should read --OR--; and
    Line 13, "supplys" should read --supplies--.

COLUMN 3

Line 5, "supplys" should read --supplies--.

COLUMN 6

Line 28, "supply;" should read --supply; and--.

COLUMN 12

Line 40, "terminals" should read --terminal--.

COLUMN 14

Line 43, "Ibias; in" should read --Ibias. In--.

UNITED STATES PATENT AND TRADEMARK OFFICE
CERTIFICATE OF CORRECTION

PATENT NO.      : 6,127,857
DATED           : October 3, 2000
INVENTOR(S)     : KATSUHISA OGAWA ET AL.

It is certified that error appears in the above-identified patent and that said Letters Patent is hereby corrected as shown below:

COLUMN 16

Line 53, "OV." should read --O V.--.

Signed and Sealed this

Twenty-second Day of May, 2001

*Attest:*

NICHOLAS P. GODICI

*Attesting Officer*    *Acting Director of the United States Patent and Trademark Office*